(12) United States Patent
Park

(10) Patent No.: US 10,177,208 B2
(45) Date of Patent: Jan. 8, 2019

(54) FLEXIBLE DISPLAY APPARATUS INCLUDING A CURVED SURFACE PORTION HAVING A CORRECTING LAYER

(71) Applicant: SAMSUNG DISPLAY CO., LTD., Yongin-si, Gyeonggi-do (KR)

(72) Inventor: Youngseo Park, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/470,171

(22) Filed: Mar. 27, 2017

(65) Prior Publication Data

US 2017/0287997 A1 Oct. 5, 2017

(30) Foreign Application Priority Data

Mar. 29, 2016 (KR) .................. 10-2016-0037775

(51) Int. Cl.
*H01L 29/08* (2006.01)
*H01L 27/32* (2006.01)
*H01L 51/00* (2006.01)

(52) U.S. Cl.
CPC ...... *H01L 27/3258* (2013.01); *H01L 51/0097* (2013.01); *H01L 2251/5338* (2013.01); *Y02E 10/50* (2013.01)

(58) Field of Classification Search
CPC .................................................. H01L 27/3258
USPC ......................................................... 257/40
See application file for complete search history.

(56) References Cited

U.S. PATENT DOCUMENTS

| 6,670,754 B1* | 12/2003 | Murai | H01J 11/12 313/582 |
| 8,604,501 B2* | 12/2013 | Yun | B82Y 20/00 257/40 |
| 9,306,188 B2 | 4/2016 | Kim et al. | |
| 2003/0075714 A1* | 4/2003 | Fukuoka | H01L 51/5262 257/40 |
| 2014/0267958 A1* | 9/2014 | Sugita | G02B 27/2214 349/15 |
| 2014/0312319 A1 | 10/2014 | Kim | |
| 2014/0362126 A1 | 12/2014 | Jeong et al. | |
| 2015/0028307 A1* | 1/2015 | Kim | H01L 51/56 257/40 |

(Continued)

FOREIGN PATENT DOCUMENTS

| KR | 10-2010-0128604 | 12/2010 |
| KR | 10-2014-0124614 | 10/2014 |
| KR | 10-2014-0144612 | 12/2014 |

(Continued)

*Primary Examiner* — Caleb Henry
(74) *Attorney, Agent, or Firm* — Lee & Morse, P.C.

(57) ABSTRACT

A flexible display apparatus including a substrate including a flat surface portion and at least one curved surface portion, and a display including a first display region above the flat surface portion and a second display region above the at least one curved surface portion. The second display region includes a correcting layer including a first point and a second point apart from each other. The second point is farther away from the first display region than the first point. A thickness of the correcting layer at the second point is greater than a thickness of the correcting layer at the first point. The correcting layer includes a curved portion between the first point and the second point.

12 Claims, 4 Drawing Sheets

(56) References Cited

U.S. PATENT DOCUMENTS

2015/0102353 A1* 4/2015 Wang .................. H01L 27/1248
257/72

FOREIGN PATENT DOCUMENTS

| KR | 10-2015-0005276 | 1/2015 |
| KR | 10-2015-0044763 | 4/2015 |

* cited by examiner

FLEXIBLE DISPLAY APPARATUS INCLUDING A CURVED SURFACE PORTION HAVING A CORRECTING LAYER

CROSS-REFERENCE TO RELATED APPLICATION

Korean Patent Application No. 10-2016-0037775, filed on Mar. 29, 2016, in the Korean Intellectual Property Office, and entitled: "Flexible Display Apparatus," is incorporated by reference herein in its entirety.

BACKGROUND

1. Field

One or more embodiments relate to a flexible display apparatus.

2. Description of the Related Art

Along with the development of information technology, the market of a display device, which is a connecting medium between a user and information, is expanding. Therefore, uses of display apparatuses, such as a liquid crystal display (LCD), an organic light-emitting diode (OLED) display, an electrophoretic display (EPD), and a plasma display panel (PDP), are increasing.

SUMMARY

Embodiments are directed to a flexible display apparatus including a substrate including a flat surface portion and at least one curved surface portion, and a display including a first display region above the flat surface portion and a second display region above the at least one curved surface portion. The second display region includes a correcting layer including a first point and a second point apart from each other. The second point is farther away from the first display region than the first point. A thickness of the correcting layer at the second point is greater than a thickness of the correcting layer at the first point. The correcting layer includes a curved portion between the first point and the second point.

The second display region may include a plurality of pixels. Each of the plurality of pixel may include the correcting layer.

A top surface of the correcting layer may be inclined from a plane parallel to a top surface of the substrate by a first angle at the first point. The top surface of the correcting layer may be inclined from the plane parallel to the top surface of the substrate by a second angle at the second point, the second angle being different from the first angle.

The second angle may be greater than the first angle.

A slope of a tangent line of the curved top surface of the correcting layer may gradually increase in a direction from the first point toward the second point.

The plurality of pixel may include at least a first pixel and a second pixel that are adjacent to each other. The first pixel may include a first correcting layer, a top surface of which has a first curvature. The second pixel may include a second correcting layer, a top surface of which has a second curvature.

The first curvature may be different from the second curvature.

The second pixel may be farther away from the first display region than the first pixel. The second curvature is greater than the first curvature.

The display may include a thin-film transistor and a display element electrically connected to the thin-film transistor. The display element includes a first electrode electrically connected to the thin-film transistor, a second electrode facing the first electrode, and an intermediate layer between the first electrode and the second electrode.

The correcting layer may be between the thin-film transistor and the display element.

The first electrode, the intermediate layer, and the second electrode may have shapes corresponding to a shape of a top surface of the correcting layer.

The first display region and the second display region may be continuous regions.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
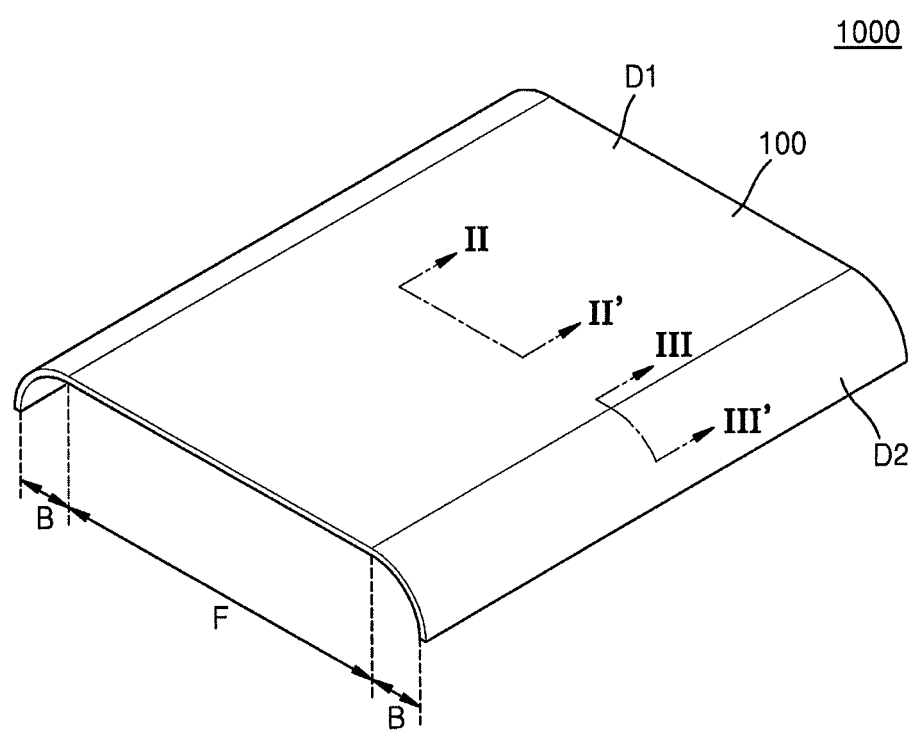
FIG. 1 illustrates a perspective view of a flexible display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It is to be understood that although the terms "first", "second", etc. may be used herein to describe various components, these components should not be limited by these terms. These components are only used to distinguish one component from another.

Figure 2:
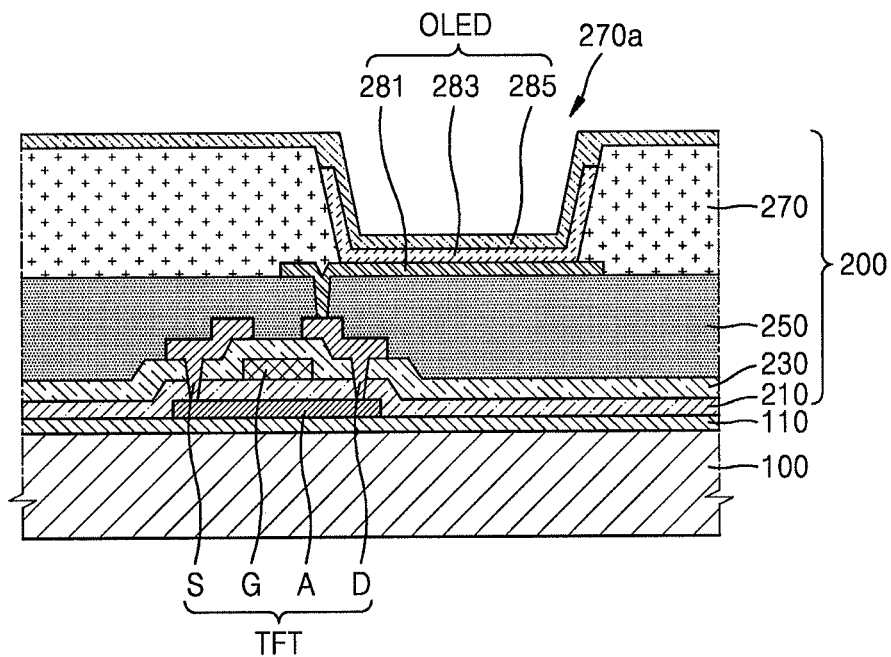
FIG. 2 illustrates a cross-sectional view of the flexible display apparatus of FIG. 1, taken along line II-II' of FIG. 1.
Figure 3:
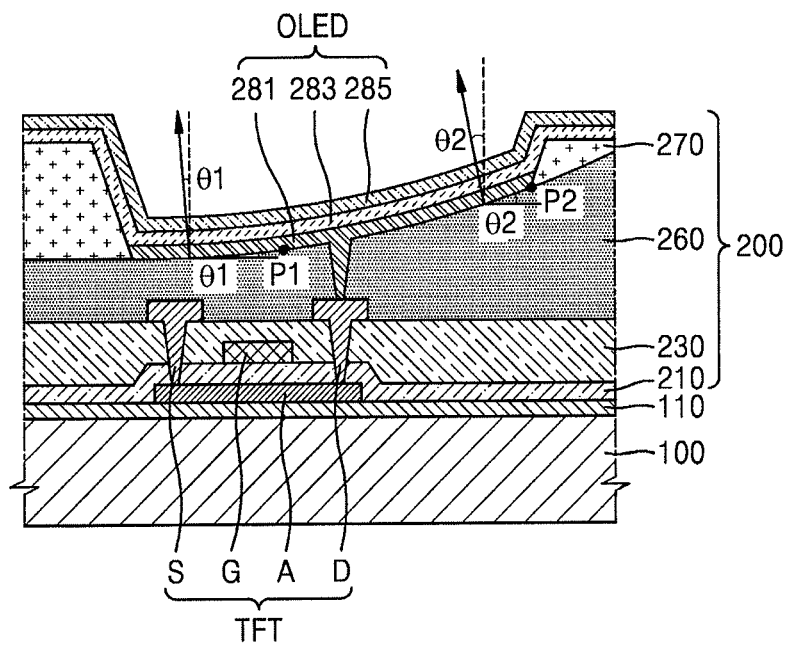
FIG. 3 illustrates a cross-sectional view of the flexible display apparatus of FIG. 1, taken along line III-III' of FIG. 1.
Figure 4:
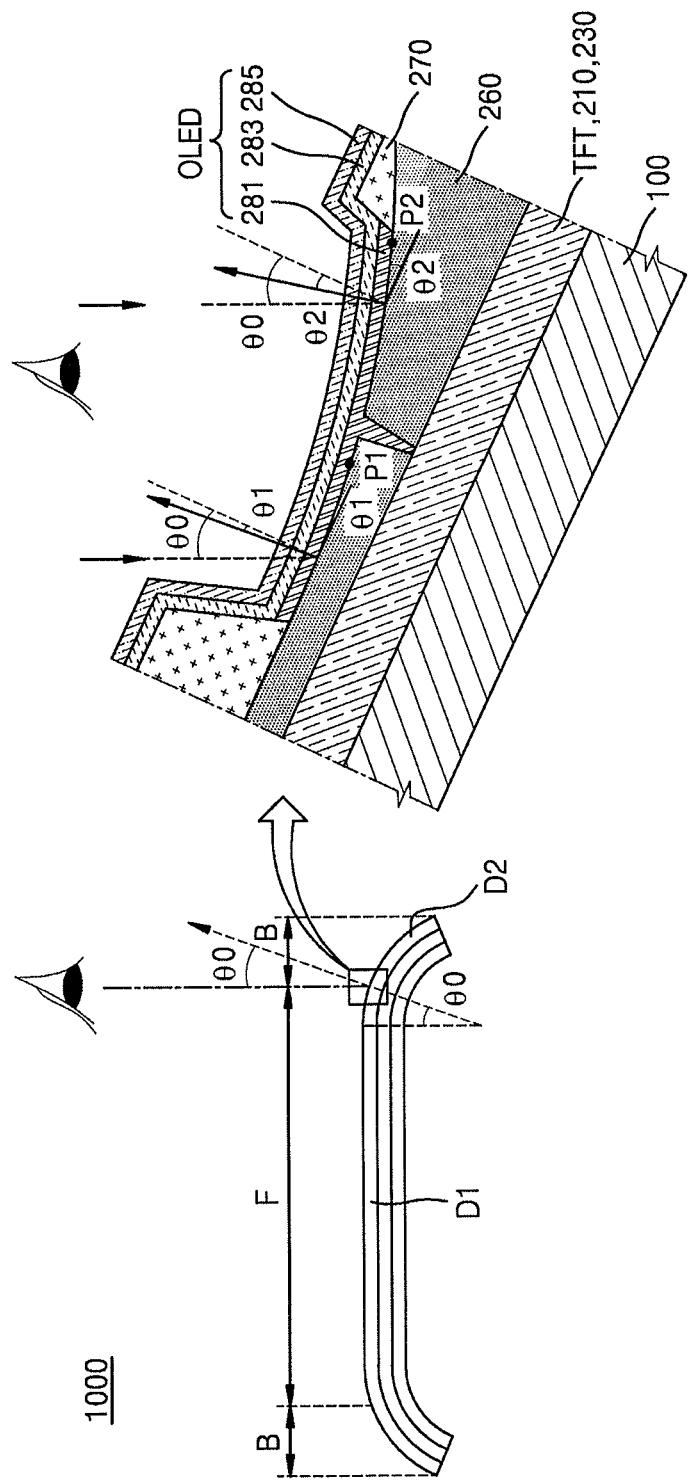
FIG. 4 illustrates a cross-sectional view of a flexible display apparatus according to an embodiment and a magnified cross-sectional view of one pixel in a second display region of the flexible display apparatus.

FIG. 1 illustrates a perspective view of a flexible display apparatus according to an embodiment, FIG. 2 illustrates a cross-sectional view of the flexible display apparatus of FIG. 1, taken along line II-II' of FIG. 1, and FIG. 3 illustrates a cross-sectional view of the flexible display apparatus of FIG. 1, taken along line III-III' of FIG. 1. FIG. 4 illustrates a cross-sectional view of the flexible display apparatus according to an embodiment and a magnified cross-sectional view of one pixel in a second display region of the flexible display apparatus.

Referring to FIGS. 1 through 4, a flexible display apparatus 1000 according to an embodiment may include a substrate 100 and a display 200 above the substrate 100. The display 200 may include a first display region D1 and a second display region D2 including a correcting layer 260.

The substrate 100 may include a flexible plastic material. For example, the substrate 100 may include polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), cellulose acetate propionate, acetate propionate (CAP), etc.

When the flexible display apparatus 1000 is a bottom emission-type display apparatus in which an image is provided in a direction toward the substrate 100, the substrate 100 may include a transparent material. However, when the flexible display apparatus 1000 is a top emission-type display apparatus in which an image is provided in a direction toward the display 200, the substrate 100 may include a non-transparent material. For example, the substrate 100 may include a flexible opaque metal. When the substrate 100 includes a metal, the substrate 100 may include at least one selected from a group consisting of iron, chromium, manganese, nickel, titanium, molybdenum, stainless steel (SUS), an Invar alloy, an Inconel alloy, and a Kovar alloy. In some implementations, the substrate 100 may include a metal foil.

The substrate 100 may include a flat surface portion F and at least one curved surface portion B. The curved surface portion B may be continuous with the flat surface portion F. FIG. 1 shows an example in which the substrate 100 includes a pair of curved surface portions B located at both sides of the flat surface portion F, respectively. The pair of curved surface portions B may have a same shape or may have different shapes. In some implementations, the pair of curved surface portions B may have a constant curvature or a shape in which the curvature changes. In some implementations, the curved surface portion B may be disposed at only one of the edges of the flat surface portion F, may be disposed at all edges of the flat surface portion F, or may be disposed inside of the flat surface portion F, as examples.

The display 200 may be disposed above the substrate 100 to provide an image. The display 200 may include a first display region D1 above the flat surface portion F and a second display region D2 above the at least one curved surface portion B. The first display region D1 and the second display region D2 may be continuous regions. The first display region D1 and the second display region D2 may implement one display screen together or may implement different display screens.

The display 200 may include various suitable types of display elements. For example, the display 200 may include a thin-film transistor TFT and an organic light-emitting device OLED.

The display 200 in the first display region D1 will be described in more detail with reference to FIG. 2.

A buffer layer 110 may be disposed above the substrate 100. The buffer layer 110 may help prevent impurity ions from diffusing into the display 200, help prevent the penetration of moisture or outside air into the display 200, and function as a barrier layer and/or a blocking layer for planarizing the surface of the substrate 100. The buffer layer 110 may include, for example, an inorganic material, such as silicon oxide, silicon nitride, silicon oxynitride, aluminum oxide, aluminum nitride, titanium oxide, or titanium nitride, or an organic material, such as polyimide, polyester, or acryl. The buffer layer 110 may include a plurality of stacked layers including the above-stated materials.

The thin-film transistor TFT may be disposed above the substrate 100. The thin-film transistor TFT may include a semiconductor layer A, a gate electrode G, a source electrode S, and a drain electrode D. The thin-film transistor TFT illustrated in FIG. 2 is an example of a top gate-type thin-film transistor TFT sequentially including the semiconductor layer A, the gate electrode G, the source electrode S, and the drain electrode D in this stated order. In some implementations, various other types of thin-film transistors TFT, such as a bottom gate-type thin-film transistor TFT, may be employed.

The semiconductor layer A may include an inorganic semiconductor, such as silicon, or an organic semiconductor. The semiconductor layer A may include a source region, a drain region, and a channel region therebetween. For example, when the semiconductor layer A includes amorphous silicon, an amorphous silicon layer may be disposed above the entire surface of the substrate 100, a polycrystalline silicon layer may be formed by crystallizing the same, the polycrystalline silicon layer may be patterned, and a source region and a drain region at edges of the polycrystalline silicon layer may be doped with an impurity. As a result, the semiconductor layer A including the source region, the drain region, and the channel region therebetween may be disposed.

A gate insulating layer 210 may be disposed over the entire surface of the substrate 100 and on top of the semiconductor layer A after the semiconductor layer A is disposed. The gate insulating layer 210 may include a multi-layered film or a single layer film including an inorganic material, such as silicon oxide or silicon nitride. The gate insulating layer 210 may insulate the semiconductor layer A from the gate electrode G above the semiconductor layer A.

The gate electrode G may be disposed in a certain region above the gate insulation film 210. The gate electrode G may be connected to a gate line by which ON/OFF signals are applied to the thin-film transistor TFT. The gate electrode G may include a suitable material by taking design conditions into account. For example, the gate electrode G may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

After the gate electrode G is disposed, an interlayer insulation film 230 may be disposed over the entire surface of the substrate 100 for insulation between the gate electrode G and the source electrode S and insulation between the gate electrode G and the drain electrode D.

The interlayer insulation film 230 may include an inorganic material. For example, the interlayer insulation film 230 may include a metal oxide or a metal nitride. For example, the inorganic material may include silicon oxide ($SiO_2$), silicon nitride ($SiN_x$), silicon oxynitride (SiON), aluminum oxide ($Al_2O_3$), titanium oxide, ($TiO_2$), tantalum oxide ($Ta_2O_5$), hafnium oxide ($HfO_2$), or zinc oxide ($ZrO_2$).

The interlayer insulation film 230 may include a multi-layered film or a single layer film including an inorganic material, such as silicon oxide ($SiO_x$) and/or silicon nitride ($SiN_x$). In some embodiments, the interlayer insulating layer 230 may have a double-layer structure of $SiO_x/SiN_y$, or $SiN_x/SiO_y$.

The source electrode S and the drain electrode D may be disposed above the interlayer insulation film 230. For example, the interlayer insulation film 230 and the gate insulation film 210 may expose the source region and the drain region of the semiconductor layer A, and the source electrode S and the drain electrode D contact the source region and the drain region of the semiconductor layer A, respectively.

The source electrode S and the drain electrode D may include a single layer or a plurality of layers including one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

The thin-film transistor TFT may be electrically connected to the organic light-emitting device OLED and may apply a signal for driving the organic light-emitting device OLED to the organic light-emitting device OLED. The thin-film transistor TFT may be covered and protected by a planarizing film 250.

The planarizing film 250 may include an inorganic insulation film and/or an organic insulation film. The inorganic insulation film may include $SiO_2$, $SiN_x$, SiON, $Al_2O_3$, $TiO_2$, $Ta_2O_5$, $HfO_2$, $ZrO_2$, BST, or PZT. The organic insulation film may include a general polymer such as polymethylmethacrylate (PMMA) or polystyrene (PS), a polymer derivative including a phenol-based group, an acrylic polymer, an imide polymer, an aryl ether polymer, an amide polymer, a fluorine polymer, a p-xylene polymer, a vinyl alcohol polymer, or a blend thereof. The planarizing film 250 may also have a composite stacked structure including an inorganic insulation film and an organic insulation film.

The organic light-emitting device OLED may be provided above the planarization layer 250. The organic light-emitting device OLED may include a first electrode 281, an intermediate layer 283 including an organic emission layer, and a second electrode 285. Holes and electrons respectively injected by the first electrode 281 and the second electrode 285 of the organic light-emitting device OLED may be combined with each other in the organic emission layer of the intermediate layer 283, thereby emitting light.

The first electrode 281 may be disposed above the planarization layer 250 and may be electrically connected to the drain electrode D through a contact hole formed in the planarization layer 250. In some implementations, the first electrode 281 may be electrically connected to the source electrode S and may receive a signal for driving the organic light-emitting device OLED from the source electrode S.

The first electrode 281 may include a reflective electrode and a transparent layer or a semi-transparent electrode film disposed above the reflective electrode. The reflective electrode may include a reflective film including Ag, Mg, Al, Pt, Pd, Au, Ni, Nd, Ir, Cr, or a compound thereof. The transparent or semi-transparent electrode film may include at least one selected from a group of indium tin oxide (ITO), indium zinc oxide (IZO), zinc oxide (ZnO), indium oxide ($In_2O_3$), indium gallium oxide (IGO), and aluminum zinc oxide (AZO).

The intermediate layer 283 may include an organic emission layer. In some implementations, the intermediate layer 283 may include an organic emission layer and may further include various other functional layers. For example, the intermediate layer 283 may include an organic emission layer and may further include at least one of a hole injection layer (HIL), a hole transport layer, an electron transport layer, and an electron injection layer.

The second electrode 285 may be disposed above the intermediate layer 283. The second electrode 285 may generate an electric field with the first electrode 281, such that light may be emitted from the intermediate layer 283. The first electrode 281 may be patterned on a pixel-by-pixel basis, and the second electrode 285 may apply a common voltage to all of the pixels.

The second electrode 285 disposed to face the first electrode 281 may include a transparent or semi-transparent electrode and may include a metal thin-film having a low work function including Li, Ca, LiF/Ca, LiF/Al, Al, Ag, Mg, or a compound thereof. An auxiliary electrode layer or a bus electrode may be further disposed above the metal thin-film. The auxiliary electrode layer may include a transparent electrode-forming material, such as ITO, IZO, ZnO, or $In_2O_3$.

The second electrode 285 may transmit therethrough light emitted by the organic emission layer included in the intermediate layer 283. Light emitted from the organic emission layer may be either directly emitted toward the second electrode 285 or reflected by the first electrode 281, which may include a reflective electrode, toward the second electrode 285.

In some implementations, the display 200 may be a bottom emission-type display in which light emitted by the organic emission layer is emitted toward the substrate 100. In this case, the first electrode 281 may include a transparent or semi-transparent electrode, and the second electrode 285 may include a reflective electrode. In some implementations, the display 200 may be a dual emission-type display that emits light in both directions, i.e., toward the substrate 100 and toward the second electrode 285.

Selectively, the first electrode 281 may be patterned. For example, the first electrode 281 may be patterned pixel-by-pixel. The display 200 may further include a pixel-defining film 270 disposed above the first electrode 281. The pixel-defining film 270 may include an opening 270a exposing the first electrode 281. The intermediate layer 283 may be disposed to correspond to the opening 270a and may be electrically connected to the first electrode 281. The pixel-defining film 270 may be disposed by a method such as spin coating and may include one or more organic insulating materials selected from a group consisting of polyimide, polyamide, acrylic resin, benzocyclobutene, and phenol resin.

Hereinafter, the display 200 in the second display region D2 will be described in more detail with reference to FIGS. 1, 3, and 4. In FIGS. 3 and 4, the same reference numerals as those in FIGS. 1 and 2 denote the same elements, and thus, for simplification of explanation duplicate descriptions thereof will be not be repeated.

The display 200 in the second display region D2 may include a correcting layer 260 disposed above the interlayer insulation film 230 so as to cover the source electrode S and the drain electrode D.

The correcting layer 260 may be disposed above the same layer as the planarization layer 250 included in the display 200 in the first display region D1.

In some implementations, the correcting layer 260 may be disposed simultaneously with the planarizing film 250.

The correcting layer 260 may include an inorganic insulation film and/or an organic insulation film. The inorganic insulation film may include $SiO_2$, $SiN_x$, SiON, $Al_2O_3$, $TiO_2$, Ta$_2$O$_5$, HfO$_2$, ZrO$_2$, BST, and PZT. The organic insulation film may include a general polymer (PMMA, PS), a polymer derivative including a phenol-based group, an acrylic polymer, an imide polymer, an aryl ether polymer, an amide polymer, a fluorine polymer, a p-xylene polymer, a vinyl alcohol polymer, or a blend thereof. The correcting layer 260 may also have a composite stacked structure including an inorganic insulation film and an organic insulation film.

The correcting layer 260 may be disposed between the thin-film transistor TFT and the organic light-emitting device OLED, as shown in FIG. 3.

The correcting layer 260 may include a first point P1 and a second point P2 apart from each other.

The second point P2 may be a point that is farther away from the first display region D1 than the first point P1. For example, a distance between the second point P2 and the first display region D1 may be greater than a distance between the first point P1 and the first display region D1.

In FIGS. 3 and 4, the first point P1 and the second point P2 are designated as particular points. However, embodiments are not limited thereto. The first point P1 and the second point P2 may be any points as long as the first point P1 and the second point P2 are on the correcting layer 260 and the second point P2 is farther from the first display region D1 than the first point P1.

In some implementations, the thickness of the correcting layer 260 at the second point P2 may be greater than the thickness of the correcting layer 260 at the first point P1.

In this case, the thickness of the correcting layer 260 may gradually increase in a direction from the first point P1 to the second point P2.

In the display device 1000 according to the present embodiment, the top surface of the correcting layer 260 may be curved between the first point P1 and the second point P2.

For example, the thickness of the correcting layer 260 may gradually increase in a direction from the first point P1 to the second point P2. The thickness of the correcting layer 260 may significantly increase in the direction from the first point P1 to the second point P2.

As shown in FIGS. 3 and 4, the top surface of the correcting layer 260 at the first point P1 may be at a first angle θ1 from a plane parallel to the top surface of the substrate 100. The top surface of the correcting layer 260 at the second point P2 may be at a second angle θ2 from a plane parallel to the substrate 100.

The first angle θ1 and the second angle 82 may be different from each other.

In some implementations, the second angle θ2 may be greater than the first angle θ1. The angle at which the top surface of the correcting layer 260 is inclined from the plane parallel to the top surface of the substrate 100 may gradually increase from the first angle θ1 to the second angle θ2.

For example, the top surface of the correcting layer 260 may be curved, and the slope of a tangent line of the top surface of the correcting layer 260 may increase in a direction from the first point P1 to the second point P2. The slope of the tangent line at a plurality of points on the top surface of the correcting layer 260 may gradually increase as a distance from the first display region D1 increases.

The display device 1000 according to the present embodiment may be configured such that the top surface of the correcting layer 260 is curved in the second display region D2 and the thickness of the correcting layer 260 increases as a distance from the first display region D1 increases. Therefore, a color difference in the first display region D1 and the second display region D2 may decrease as the thickness of the layer 260 increases.

For example, when the flexible display apparatus 1000 is a top emission-type, light may be emitted perpendicularly from the organic light-emitting device OLED to the front surface.

When the second display region D2 of the flexible display apparatus 1000 is located above the curved surface portion B, compared to the first display region D1 located above the flat surface portion F, an angle may be formed between a line of sight of a user and a light beam emitted from the second display region D2 in correspondence to a curved angle θ0 of the curved surface portion B.

When there is an angle difference corresponding to the curved angle θ0 of the curved surface portion B, an optical distance when the user views the first display region D1 differs from an optical distance when the user views the second display region D2. For example, when angles between the line of sight of the user and the emitted light beam differ in the first display region D1 and the second display region D2, the resonance wavelengths may be different in the first display region D1 and the second display region D2, and thus the user may recognize that colors of the first display region D1 and the second display region D2 are different from each other.

In the flexible display apparatus 1000 according to the present embodiment, the display 200 in the second display region D2 includes the correcting layer 260 a top surface of which is a curved surface, such that an angle between a line of sight of a user and a light beam emitted from the second display region D2 becomes smaller than a curved angle θ0 of the curved surface portion.

For example, as shown in FIGS. 3 and 4, the top surface of the correcting layer 260 may be inclined by the first angle θ1 from the plane parallel to the top surface of the substrate 100 at the first point P1. Thus an angle between a line of sight of a user and a light beam emitted from the second display region D2 may correspond to the curved angle θ0 of the curved surface portion B, which is less the first angle θ1. For example, the angle between the line of sight of a user and the light beam emitted from the second display region D2 may be θ0-θ1.

At the second point P2, farther from the first display region D1, the top surface of the correcting layer 260 may be inclined from the plane parallel to the ground by a second angle θ2 that is greater than the first angle θ1. Thus, an angle between a line of sight of a user and a light beam emitted from the second display region D2 may be reduced by the second angle θ2 that is greater than the first angle θ1. For example, the angle between the line of sight of a user and the light beam emitted from the second display region D2 may be θ0-θ2.

As the distance from the first display region D1 increases, the top surface of the correcting layer 260 may be inclined by a greater angle. Accordingly, a difference between colors in the first display region D1 and the second display region D2 may be reduced.

The display 200 in the second display region D2 may include an organic light-emitting device OLED provided above the correcting layer 260. As described above, the organic light-emitting device OLED may include the first electrode 281, the intermediate layer 283, and the second electrode 285. The first electrode 281, the intermediate layer 283, and the second electrode 285 may be identical to those of FIG. 2, and thus, for convenience of explanation, a detailed description thereof will not be repeated.

The first electrode 281, the intermediate layer 283, and the second electrode 285 disposed above the correcting layer 260 in the second display region D2 may have shapes corresponding to the shape of the top surface of the correcting layer 260.

The top surface of the correcting layer 260 may be curved, and thus, the first electrode 281 disposed above the correcting layer 260 may also have a curved shape corresponding to the shape of the top surface of the correcting layer 260.

When the first electrode 281 is disposed to have a curved shape, the intermediate layer 283 and the second electrode 285 disposed above the first electrode 281 may also be disposed to have curved shapes.

As described above, a difference between angles of lines of sight of a user and the flexible display apparatus 1000 with respect to the first display region D1 and the second display region D2 may be reduced. Furthermore, a difference between optical distances and a difference between resonance wavelengths may also be reduced. Thus, a color difference between the first display region D1 and the second display region D2 may be reduced.

Figure 5:
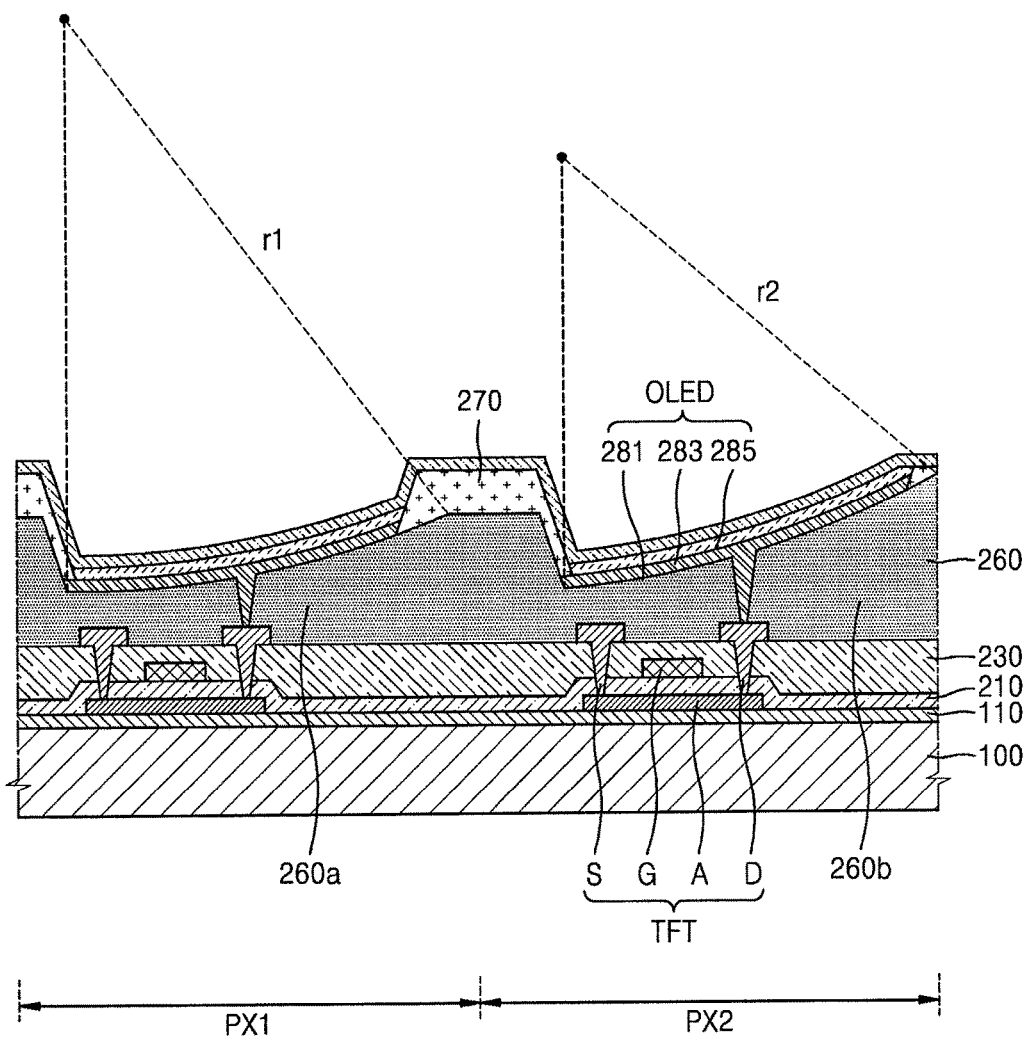
FIG. 5 illustrates a cross-sectional view of a portion of a display located in a second display region, according to an embodiment.

FIG. 5 illustrates a cross-sectional view of a portion of a display in a second display region, according to an embodiment. In FIG. 5, reference numerals identical to those of FIGS. 1 through 4 denote the same elements. Thus, for convenience of explanation, a detailed description thereof will not be omitted.

The second display region D2 may include a plurality of pixels. Each of the plurality of pixels may emit red light, blue light, green light, or white light, respectively.

The second display region D2 may include at least two neighboring pixels. For example, as shown in FIG. 5, the second display region D2 may include a first pixel PX1 and a second pixel PX2.

The first pixel PX1 may be located closer to the first display region D1 than the second pixel PX2. For example a distance between the first pixel PX1 and the first display region D1 may be less than a distance between the second pixel PX2 and the first display region D1.

For example, the second pixel PX2 may be disposed closer to an edge of the substrate 100 than the first pixel PX1 and may be disposed at a portion corresponding to a greater curved angle. For example a distance between the second pixel PX2 and the edge of the substrate 100 may be less than a distance between the first pixel PX1 and the edge of the substrate 100.

Each of the first pixel PX1 and the second pixel PX2 may include the thin-film transistor TFT disposed above the substrate 100, the correcting layer 260 disposed above the thin-film transistor TFT, and the organic light-emitting device OLED disposed above the correcting layer 260.

The correcting layer 260 may include the curved top surface The thickness of the correcting layer 260 may increase as a distance from the first display region D1 increases.

For example, as a distance from the first display region D1 increases, the curvature of the correcting layer 260 may significantly increase. The slope of a tangent line of the top surface of the correcting layer 260 may gradually increase.

The top surface of a first correcting layer 260a included in the first pixel P1 may have a first curvature.

The top surface of a second correcting layer 260b included in the second pixel PX2 may have a second curvature.

As background, the curvature is a rate of change indicating a degree of bending of a curve. When a point p on a curve moves at a constant speed along the curve, the direction in which the point p moves changes based on the moved distance. A rate of change of the direction is referred to as the curvature of the curve.

A curvature radius r and a curvature are reciprocal to each other. For example, a value of a curvature may be expressed as the inverse value (1/r) of a curvature radius r.

The curvature of the top surface of the first correcting layer 260a ("first curvature") may be 1/r1, which is the inverse value of the first curvature radius r1.

The second curvature of the top surface of the second correcting layer 260b ("second curvature") may be 1/r2, which is the inverse value of the second curvature radius r2.

The first curvature PH and the second curvature 1/r2 may be different from each other.

The second curvature 1/r2 may be greater than the first curvature 1/r1.

Since the second pixel PX2 is farther away from the first display region D1 than the first pixel PX1 and corresponds to a greater curved angle, the correcting layer 260 is disposed, such that the second curvature 1/r2 is greater than the first curvature 1/r1. Thus a difference between colors in the flat surface portion F (FIG. 1) and the curved surface portion B (FIG. 1) of the flexible display apparatus may be reduced.

Although FIG. 5 shows only the two neighboring pixels PX1 and PX2 from among a plurality of pixels included in the second display region D2, it is to be understood that the second display region D2 may include a larger number of pixels.

Each of the pixels may include the correcting layer 260. The curvature of the top surface of the correcting layer 260 of each of the pixels may increase as a distance from the first display region D1 increases.

The correcting layer 260 including the top surface having a large curvature may significantly reduce an angle between a line of sight of a user and an emitted light beam.

By way of summation and review, recently, not only are flat display panels in demand but also flexible display panels, which may be curved or unfolded, in various directions are in demand. However, in such a flexible display panel, when a user views a flat region and a curved region, angles formed between the user's line of sight and the display panel may be different in the flat region and the curved region. When the angle changes, an optical distance changes, and thus resonance wavelength also changes. As a result, colors of the flat region and the curved region of the display panel are recognized by the user differently.

Embodiments include a flexible display apparatus in which a difference between colors recognized by a user when the user views a flat region and colors recognized by a user when the user views a curved region is reduced.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A flexible display apparatus, comprising:
   a substrate including a flat surface portion and at least one curved surface portion in a macroscopic view of the flexible display apparatus; and
   a display including a first display region above the flat surface portion and a second display region above the at least one curved surface portion,
   wherein the second display region includes a correcting layer including a first point and a second point apart from each other, the second point is farther away from the first display region than is the first point, a thickness of the correcting layer at the second point is greater than a thickness of the correcting layer at the first point, and a top surface of the correcting layer includes a curved portion between the first point and the second point.

2. The flexible display apparatus as claimed in claim 1, wherein:

the second display region includes a plurality of pixels, and each of the plurality of pixel includes the correcting layer.

3. The flexible display apparatus as claimed in claim 2, wherein a top surface of the correcting layer is inclined from a plane parallel to the top surface of the substrate by a first angle at the first point, and the top surface of the correcting layer is inclined from the plane parallel to the top surface of the substrate by a second angle at the second point, the second angle being different from the first angle.

4. The flexible display apparatus as claimed in claim 3, wherein the second angle is greater than the first angle.

5. The flexible display apparatus as claimed in claim 2, wherein:

a slope of a tangent line of the curved portion of a top surface of the correcting layer gradually increases in a direction from the first point toward the second point.

6. The flexible display apparatus as claimed in claim 2, wherein the plurality of pixels includes at least a first pixel and a second pixel that are adjacent to each other, the first pixel includes a first correcting layer, a top surface of which has a first curvature, and the second pixel includes a second correcting layer, a top surface of which has a second curvature.

7. The flexible display apparatus as claimed in claim 6, wherein the first curvature is different from the second curvature.

8. The flexible display apparatus as claimed in claim 7, wherein:

the second pixel is farther away from the first display region than the first pixel, and the second curvature is greater than the first curvature.

9. The flexible display apparatus as claimed in claim 1, wherein:

the display includes a thin-film transistor and a display element electrically connected to the thin-film transistor, and the display element includes a first electrode electrically connected to the thin-film transistor, a second electrode facing the first electrode, and an intermediate layer between the first electrode and the second electrode.

10. The flexible display apparatus as claimed in claim 9, wherein the correcting layer is between the thin-film transistor and the display element.

11. The flexible display apparatus as claimed in claim 9, wherein the first electrode, the intermediate layer, and the second electrode have shapes corresponding to a shape of a top surface of the correcting layer.

12. The flexible display apparatus as claimed in claim 1, wherein the first display region and the second display region are continuous regions.

* * * * *